(12) United States Patent
Chen et al.

(10) Patent No.: US 6,623,995 B1
(45) Date of Patent: Sep. 23, 2003

(54) OPTIMIZED MONITOR METHOD FOR A METAL PATTERNING PROCESS

(75) Inventors: Hsien-Tsong Chen, Junghe (TW); Ming-Shuo Yen, Hsinchu (TW); Woan Tyng Hwang, Kaohsiung (TW); Yu-Chang Chen, Pingtung (TW); Tien-Tzu Wen, Hsinchu (TW); Shion-Feng Chang Chien, Kaoshiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/283,437

(22) Filed: Oct. 30, 2002

(51) Int. Cl.$^7$ ................................................ H01L 21/66
(52) U.S. Cl. .............................. 438/14; 438/15; 438/17; 438/18; 257/48
(58) Field of Search ........................... 438/5–6, 10–11, 438/14–15, 17–18; 257/48

(56) References Cited

U.S. PATENT DOCUMENTS

| | | | | |
|---|---|---|---|---|
| 5,576,554 A | * | 11/1996 | Hsu ............................ | 257/48 |
| 5,843,799 A | * | 12/1998 | Hsu et al. ..................... | 438/6 |
| 5,872,018 A | * | 2/1999 | Lee ............................. | 438/18 |
| 6,124,143 A | * | 9/2000 | Sugasawara ................. | 438/18 |
| 6,133,055 A | * | 10/2000 | Yeh ............................. | 438/18 |
| 6,235,642 B1 | * | 5/2001 | Lee et al. .................... | 438/710 |
| 6,521,910 B1 | * | 2/2003 | Lin ............................. | 257/48 |

* cited by examiner

Primary Examiner—John F. Niebling
Assistant Examiner—Lynne A. Gurley
(74) Attorney, Agent, or Firm—George O. Saile; Stephen B Ackerman; Rosemary L. S. Pike

(57) ABSTRACT

A method of early and effective detection of defects in a metal patterning process is described. A test keys structure is provided comprising a plurality of test keys in scribe lines of a control monitor wafer wherein more than 300 test keys are formed on a control monitor wafer and wherein each of the plurality of test keys has an area of at least $10^6$ $\mu m^2$. A metal layer is deposited on the control monitor wafer. A dielectric layer is deposited overlying the metal layer. Thereafter, the control monitor wafer is tested using the plurality of test keys.

20 Claims, 2 Drawing Sheets

OPTIMIZED MONITOR METHOD FOR A METAL PATTERNING PROCESS

BACKGROUND OF THE INVENTION (1) Field of the Invention

The present invention relates to the fabrication of integrated circuit devices, and more particularly, to a method of monitoring defects in a metal patterning process in the fabrication of integrated circuit devices.

(2) Description of the Prior Art

In the manufacture of large scale integrated circuits, the metal line width or spacing is becoming smaller as technology progresses. As metal lines become thinner, micro-defects start to effect final product output (called $C_p$ yield) and product reliability. For example, in a 0.15 $\mu$m logic process, micro metal residue has been found between metal lines. This residue is less than 0.2 $\mu$m in size. The residue, found by product failure analysis, kills product reliability. This is known as "infant mortality." Unfortunately, this type of defect cannot be detected in-line; i.e. during fabrication; because the small size of the residue is out of the resolution limitation of defect scan tools including optical light defect inspection tools such as KLA, AIT, Compass, etc. Furthermore, the conventional Wafer Acceptance Test (WAT) spacing test key cannot catch these micro-defects. It is desired to find a way to detect micro-defects during the fabrication process.

A number of patents address testing issues. For example, U.S. Pat. No. 4,758,094 to Wihl et al. shows a metal monitor for insitu qualification of reticles. U.S. Pat. No. 6,248,661B1 to Chien et al. shows a method for monitoring bubble formation in a spin-on-glass process. U.S. Pat. No. 6,027,859 to Dawson et al. discloses an extended test structure formed in a scribe line. U.S. Pat. No. 5,897,728 to Cole et al. shows a chip attached to a temporary test structure.

SUMMARY OF THE INVENTION

Accordingly, it is a primary object of the invention to provide a fast, reliable and very manufacturable method for detecting micro-defects in a metal patterning process in the fabrication of integrated circuit devices.

A further object of the invention is to provide a process for early and effective detection of defects in a metal patterning process.

Another object is to provide a process for fabricating a defect monitor for rapid and effective detection of defects.

Yet another object is to provide a testing structure for early and effective detection of defects in a metal patterning process.

A further object is to provide a testing structure for early and effective detection of defects in a metal patterning process wherein the testing structure has an increased number of test keys and an increased size of test keys.

A still further object of the invention is to provide a process for early and effective detection of defects in a metal patterning process wherein the testing loop can be completed in 30 hours.

Yet another object is to provide a testing structure for early and effective detection of defects in a metal patterning process wherein the testing structure has a dielectric film over the metal layer in order to reduce or eliminate noise in the test.

In accordance with the objects of the invention, a method of fabricating a defect monitor for rapid and effective detection of defects in a metal patterning process is achieved. A plurality of test keys is provided in scribe lines of a control monitor wafer wherein 50 to 400 test keys, for example, are formed on the control monitor wafer and wherein each of the plurality of test keys has an area of between about 1E6 to 1E7 $\mu$m$^2$.

Also, in accordance with the objects of the invention, a method of early and effective detection of defects in a metal patterning process is achieved. A test keys structure is provided comprising a plurality of test keys in scribe lines of a control monitor wafer wherein 50 to 400 test keys are formed on the control monitor wafer and wherein each of the plurality of test keys has an area of at between about 1E6 to 1E7 $\mu$m$^2$. A metal layer is deposited on the control monitor wafer. A dielectric layer is deposited overlying the metal layer. Thereafter, the control monitor wafer is tested using some of the plurality of test keys.

Also in accordance with the objects of this invention, a method of detecting defects in a metal patterning process is achieved. A test keys structure is provided comprising a plurality of test keys in scribe lines of a control monitor wafer wherein 50 to 400 test keys are formed on the control monitor wafer and wherein each of the plurality of test keys has an area of between about 1E6 to 1E7 $\mu$m$^2$. A metal layer is deposited on the control monitor wafer and patterned to form metal lines. A dielectric layer is deposited overlying the metal lines. An opening is etched to one of the metal lines. Thereafter, the control monitor wafer is tested using some of the plurality of test keys.

Also in accordance with the objects of this invention, a test keys structure is achieved. The test keys structure comprises a plurality of test keys in scribe lines of a control monitor wafer wherein between 50 and 400 test keys are formed on the control monitor wafer and wherein each of the plurality of test keys has an area of between about 1E6 and 1E7 $\mu$m$^2$.

BRIEF DESCRIPTION OF THE DRAWINGS

In the accompanying drawings forming a material part of this description, there is shown.

DESCRIPTION OF THE PREFERRED EMBODIMENTS

The process of the present invention provides a method to detect micro-defects more easily and quickly than other in-line defect scanning methods. A wafer acceptance test (WAT) yield tile test key pattern is formed on a short loop monitor control wafer. A spacing test key is a small test structure formed in the scribe lines between die. In the present invention, 1) the area of an individual spacing test key is increased from the conventional 4.6×10$^3$ $\mu$m$^2$ to between about 1E6 to 1E7 $\mu$m$^2$, 2) the number of spacing test keys is increased from a typical 50 per wafer to preferably between about 300 and 400 per wafer, and 3) the dimension line width/spacing of the spacing test keys is reduced from a conventional 0.23/0.24 $\mu$m for a 0.15 logic product to about 0.19/0.20 $\mu$m. The increased size and number of test keys and reduced line width/spacing results in higher sensitivity of the testing structure to detect micro-defects.

Figure 4:
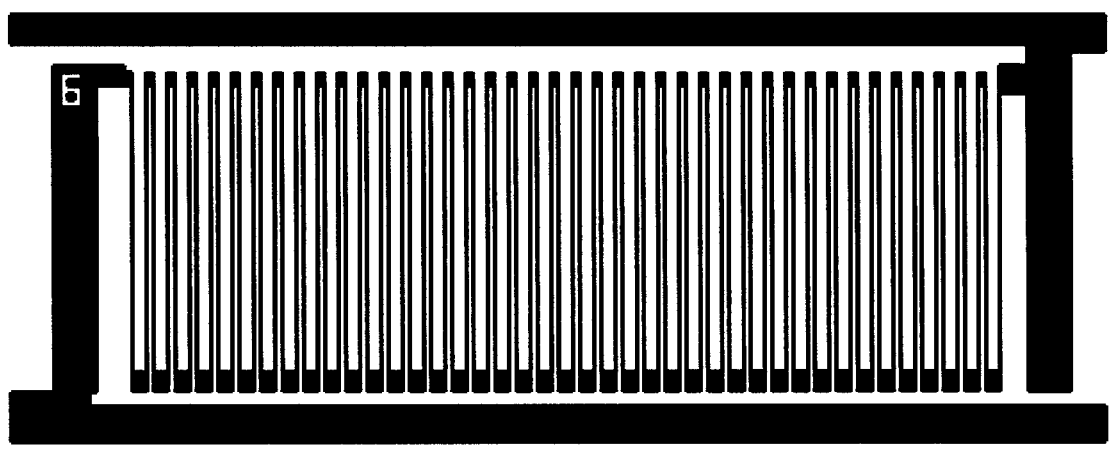
FIG. 4 is a WAT spacing test key of the present invention.

FIG. 4 shows a single WAT spacing test key for a metal patterning process. The larger test key of the present invention is more sensitive to micro-defects. The greater number of keys increase the probability of catching a defect, and the reduced dimension line width/spacing increases sensitivity to the micro-defects. The test key structure of the present invention can detect defects in metal sputtering or in metal etching. After metal sputtering, an electric test will reflect an abnormal spacing result if metal film defects exist. Resistance data will reflect abnormal film thickness. If any defect locates on the test key, the electric test result will show an abnormality. After metal etching, the electric test will show an abnormal short if metal residue appears. The electric resistance data will show an abnormal high if there is a metal line notch or damage.

In a normal process flow, the fabrication of an integrated circuit device, including multiple metal layers and final passivation, takes more than 30 days cycle time. After an integrated circuit device is completed, a WAT is applied. The process of the present invention uses a much shorter control monitor loop. The WAT test is performed after each metal layer has been completed. This provides feedback on the process and/or equipment rapidly to detect and resolve problems. By increasing the area and number of locations of the test keys, the sensitivity of the test is improved. It is critical to add a dielectric film over the metal lines before testing to reduce or eliminate noise in the test.

Figure 1:
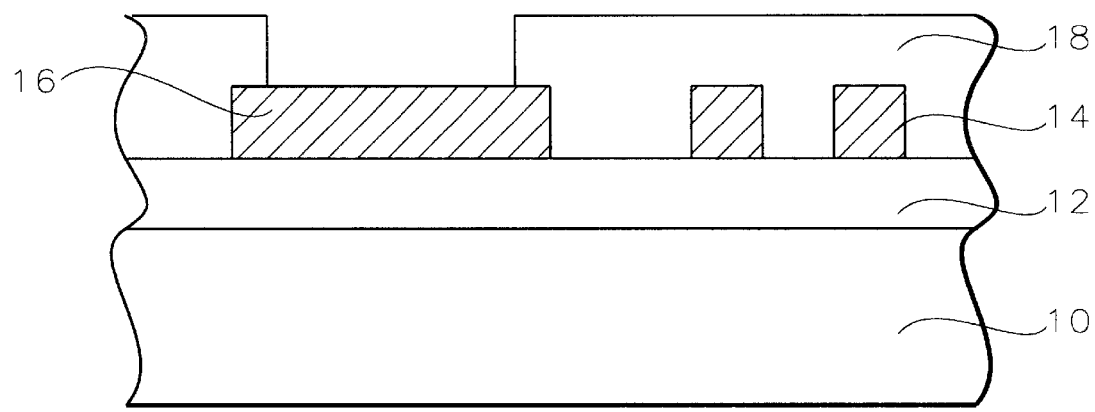
FIG. 1 is a cross-sectional representation of a control monitor wafer of the present invention.

Referring now to FIG. 1, there is illustrated a control monitor wafer substrate 10. Layer 12 contains any device structures that have been formed previously. Metal lines 14 and 16 are formed over layer 12.

An array of test keys—between 50 and 400 and preferably 300 to 400—are formed in scribe lines of the control monitor wafer. The metal line spacing and width of the test keys are at a minimum of 0.18/0.21 to 0.44/0.46 microns. For example, the design rule of width/spacing for each test key is about 0.19 $\mu$m width and 0.20 $\mu$m spacing in the metal 1 layer, about 0.24 $\mu$m width and 0.24 $\mu$m spacing in the intermetal layer, and about 0.37 $\mu$m width and 0.39 $\mu$m spacing in the top metal area. The monitor area of a single test key in the metal 1 layer is about 1.7E6 to 1E7 $\mu m^2$, in the intermetal layer, the area is about 5.5E5 $\mu m^2$, and in the top metal layer, the area is about 5.5E5 $\mu m^2$. In comparison to a conventional monitor area, the monitor area of the present invention is about 375 times the conventional monitor area in the metal 1 layer, about 116 times, in the intermetal layer, and about 93 times, in the top metal layer.

Figure 2:
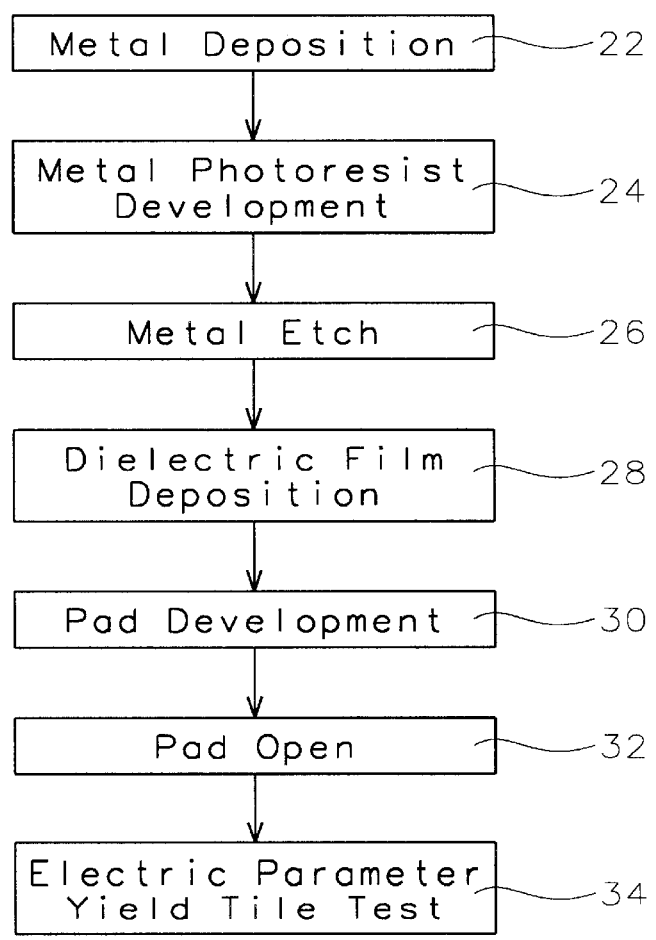
FIG. 2 is a flow chart of a short monitor loop of the present invention.

FIG. 2 illustrates a flow chart of the short loop monitor of the present invention. Step 22 is metal deposition. Next, in step 24, a photoresist pattern is formed over the metal film (not shown in FIG. 1). In step 26, the metal is etched to form metal lines 14 and 16, shown in FIG. 1. Now, a dielectric film 18 is deposited over the metal lines. This can be any dielectric film that might be used in the fabrication of an integrated circuit. This is step 28 in FIG. 2. In step 30, a photoresist pattern is developed for an opening to metal pad 16, for example. A contact opening is made to the metal pad 16, as shown in FIG. 1 and in FIG. 2, step 32. Now, a test is performed using all of the test keys. For example, an electric parameter yield tile test could be performed as shown in FIG. 2, step 34.

The cycle time for testing will be about 30 hours for one metal layer. This allows for rapid feedback and correction of the process or equipment, if necessary, to greatly improve yield and reduce infant mortality. The testing process of the present invention can be used to check the metal sputtering process and rapidly find issues that need to be corrected. It has been found that resistance and stress test methods have failed to detect problems in metal sputtering. The larger areas and greater number of test keys have the ability to detect smaller dimensional defects. Furthermore, the process of the present invention can be used to check the metal etch process. The process of the present invention provides feedback much earlier than Cp yield feedback time. This allows realization of the effect of process changes rapidly, including changes in modules or in integration. The results of any changes in process can be detected rapidly with the inventive process, before Cp yield data can be obtained.

The test keys may be any of several types of test keys, including, but not limited to, yield tile test keys. It is essential that a dielectric film be deposited over the metal layer before the test is performed so that noise can be eliminated or reduced during the test.

Figure 3:
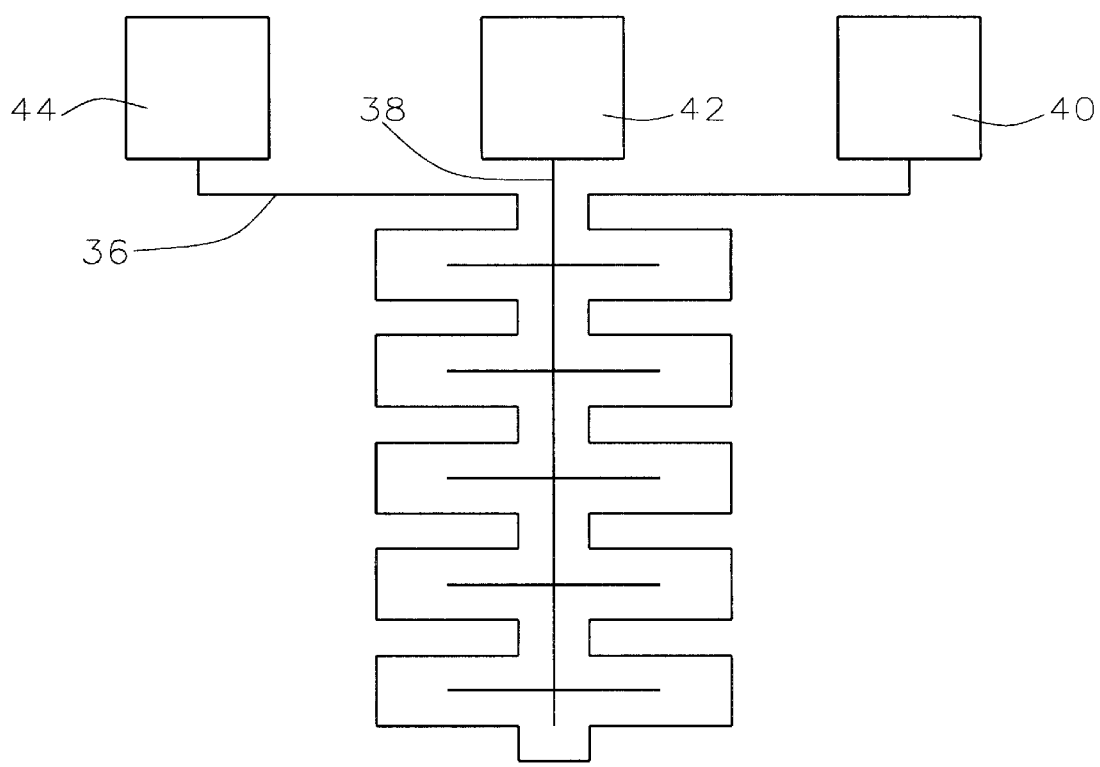
FIG. 3 is an example of a test key pattern of the present invention.

FIG. 3 illustrates an example of a yield tile test key pattern. 36 is a snake-type metal line for a spacing and resistance electric test. 38 is a comb-type metal line for a resistance electric test. 40 is a metal pad to test metal line resistance. 42 is a metal pad to test metal spacing and line resistance. 44 is a metal pad to test metal spacing (with 42) and line resistance (with 40).

The process of the present invention has been implemented. It has been found that with the more sensitive test key test of the present invention, trends in data that were missed can now be seen. Metal residue of a small dimension previously missed by inspection tools has been detected by the process of the present invention.

While the invention has been particularly shown and described with reference to the preferred embodiments thereof, it will be understood by those skilled in the art that various changes in form and details may be made without departing from the spirit and scope of the invention.

What is claimed is:

1. A method of forming a test keys structure comprising:
   providing a plurality of test keys in scribe lines of a control monitor wafer wherein 50 to 400 test keys are formed on said control monitor wafer and wherein each of said plurality of test keys has an area of at least 1E6 $\mu m^2$.

2. The method according to claim 1 wherein said plurality of test keys comprise any of several types of test keys.

3. The method according to claim 1 wherein 300 to 400 test keys are formed.

4. The method according to claim 1 wherein each of said plurality of test keys has an area of between about 1E6 and 1E7 $\mu m^2$.

5. The method according to claim 1 wherein the dimension line width/spacing of said plurality of test keys is a minimum of 0.18/0.21 $\mu$m.

6. A method of forming a test keys structure comprising:
   providing a plurality of test keys in scribe lines of a control monitor wafer more than 300 test keys are formed on said control monitor wafer and wherein each of said plurality of test keys has an area of at least 1E6 $\mu m^2$ and wherein the dimension line width/spacing of said plurality of test keys is a minimum of 0.18/0.21 $\mu$m.

7. A method of detecting defects in a metal patterning process comprising:
   providing a test keys structure comprising a plurality of test keys in scribe lines of a control monitor wafer wherein between about 50 and 400 test keys are formed on said control monitor wafer and wherein each of said plurality of test keys has an area of at least 1E6 $\mu m^2$;

depositing a metal layer on said control monitor wafer;

depositing a dielectric layer overlying said metal layer; and thereafter testing said control monitor wafer using said plurality of test keys.

8. The method according to claim 7 wherein feedback from said testing is obtained within 30 hours of said step of depositing said metal layer.

9. The method according to claim 7 wherein said plurality of test keys comprise any of several types of test keys.

10. The method according to claim 7 wherein 300 to 400 test keys are formed.

11. The method according to claim 7 wherein each of said plurality of test keys has an area of between about 1E6 and 1E7 $\mu m^2$.

12. The method according to claim 7 wherein the dimension line width/spacing of said plurality of test keys is a minimum of 0.18/0.21 $\mu m$ in said metal layer and a minimum of 0.24/0.24 $\mu m$ in said dielectric layer.

13. A method of detecting defects in a metal patterning process comprising:

providing a test keys structure comprising a plurality of test keys in scribe lines of a control monitor wafer wherein between 50 and 400 test keys are formed on said control monitor wafer and wherein each of said plurality of test keys has an area of at least 1E6 $\mu m^2$;

depositing a metal layer on said control monitor wafer;

patterning said metal layer to form metal lines;

depositing a dielectric layer overlying said metal lines;

etching an opening to one of said metal lines; and thereafter testing said control monitor wafer using said plurality of test keys.

14. The method according to claim 13 wherein feedback from said testing is obtained within 30 hours of said step of depositing said metal layer.

15. The method according to claim 13 wherein said testing checks said process of depositing said metal layer.

16. The method according to claim 13 wherein said testing checks said process of etching said metal layer.

17. The method according to claim 13 wherein said plurality of test keys comprise any of several types of test keys.

18. The method according to claim 13 wherein 300 to 400 test keys are formed.

19. The method according to claim 13 wherein each of said plurality of test keys has an area of between about 1E6 and 1E7 $\mu m^2$.

20. The method according to claim 13 wherein the dimension line width/spacing of said plurality of test keys is a minimum of 0.18/0.21 $\mu m$ in said metal layer and a minimum of 0.24/0.24 $\mu m$ in said dielectric layer.

* * * * *